United States Patent
Hong et al.

[11] Patent Number: 5,926,721
[45] Date of Patent: Jul. 20, 1999

[54] ISOLATION METHOD FOR SEMICONDUCTOR DEVICE USING SELECTIVE EPITAXIAL GROWTH

[75] Inventors: Sug-hun Hong, Seoul; Dong-ho Ahn, Kyungki-do, both of Rep. of Korea

[73] Assignee: Samsung Electronics, Co., Ltd., Suwon, Rep. of Korea

[21] Appl. No.: 08/924,467

[22] Filed: Aug. 21, 1997

[30] Foreign Application Priority Data

Feb. 17, 1997 [KR] Rep. of Korea .................. 97-4768

[51] Int. Cl.⁶ .................................................. H01L 21/76
[52] U.S. Cl. ........................................... 438/413; 438/422
[58] Field of Search ............................. 438/413, 421, 438/422, 411

[56] References Cited

U.S. PATENT DOCUMENTS

| | | | |
|---|---|---|---|
| 4,169,000 | 9/1979 | Riseman | 148/187 |
| 4,356,211 | 10/1982 | Riseman | 427/85 |
| 5,324,683 | 6/1994 | Fitch et al. | 437/65 |
| 5,353,861 | 10/1994 | Bashir et al. | 437/67 |

OTHER PUBLICATIONS

"Deep Trench Well Isolation for 256kB 6T CMOS Static RAM", VLSI 85, by Kazuhito Hashimoto, 1985 (pp. 94 & 95).

*Primary Examiner*—Brian Dutton
*Attorney, Agent, or Firm*—Marger Johnson & McCollom, P.C.

[57] ABSTRACT

An isolation method for a highly-integrated semiconductor device includes growing an epitaxial layer on the entire surface of a semiconductor substrate including over a trench on which an oxide layer is formed, thereby leaving the inside of the trench empty. A portion of the epitaxial layer which is located over the trench is then oxidized to form an isolation region.

18 Claims, 6 Drawing Sheets

ISOLATION METHOD FOR SEMICONDUCTOR DEVICE USING SELECTIVE EPITAXIAL GROWTH

This application corresponds to Korean patent application No. 974768, filed Feb. 17, 1997 in the name of Samsung Electronics Co., Ltd., which is herein incorporated by reference for all purposes.

BACKGROUND OF THE INVENTION

1. Field of the Invention

The present invention relates to the field of microelectronics, and more particularly, to a manufacturing process for fabricating isolation regions in a highly integrated semiconductor device.

2. Description of the Related Art

In general, semiconductor devices include an isolation region for electrically isolating active regions. The isolation region influences the size of the active region and process margins of a subsequent process because it is typically formed at the beginning of the semiconductor fabrication process. Accordingly, as the semiconductor circuit becomes finer and more highly integrated, a reduction in the size of the isolation region as well as each device becomes more important.

U.S. Pat. No. 5,385,861 discloses a device isolation method, applicable to highly-integrated semiconductor devices, which combines a local oxidation of silicon (LOCOS) technique and a trench isolation technique. According to this method, the inside of the trench is filled with a polysilicon layer, and then a usual LOCOS technique is performed to form an isolation region.

Also, a method of combining a selective polysilicon oxidation (SEPOX) technique and a trench isolation technique is disclosed in "Deep Trench Well Isolation for 256 kB 6T CMOS Static RAM", VLSI 85, by Kazuhito Hashimoto. According to this method, the inside of the trench is filled with a polysilicon layer, and then a pad oxide layer and a polysilicon layer are sequentially formed on the entire surface of a substrate. Then, the polysilicon layer on the substrate is oxidized to form an isolation region.

However, the combination method of the LOCOS with the trench isolation still has problems. The active region is reduced by bird's beak formation which is not entirely avoidable in the LOCOS process. Another problem is that crystal defects can occur in an interface between the trench oxide and the silicon substrate due to stress caused by lattice mismatch and a difference of thermal expansion coefficients between the silicon substrate and a silicon oxide layer during oxidation of the polysilicon filled in the trench. The crystal defect can increase leakage current of a transistor.

Problems due to such crystal defects are also found in the combination method of the SEPOX with the trench isolation, although the extent is lessen more on less. Also, the processing method is more complicated than that of LOCOS, because SEPOX use added process steps such as deposition and removing the polysilicon layer.

Accordingly a need remains for an isolation method which reduces leakage current.

SUMMARY OF THE INVENTION

The present invention is an isolation method of combining a trench isolation with a LOCOS procedure using selective epitaxial growth of silicon.

According to the present invention, first, a trench is formed in a silicon substrate and an oxide layer is formed on a surface of the trench. Then, an epitaxial layer is grown on the top surface of the substrate, over the trench in which the oxide layer is formed, resulting in a structure in which the inside of the trench is empty. Only a portion of the epitaxial layer which corresponds to an isolation region to be formed is then oxidized to complete the isolation region.

The epitaxial layer is a silicon film having a single crystalline structure. The epitaxial layer is formed at 800–1000° C. and in a thickness of 300–5000Å, depending on trench width.

The step of forming the isolation region by oxidizing only the portion of the epitaxial layer which corresponds to the isolation region can be performed by any one of the following four methods.

By a first method, a pattern, such as nitride, for defining the isolation region is formed directly on the epitaxial layer. Then, the epitaxial layer exposed by the pattern is thermally oxidized to form the isolation region, and then the pattern is removed.

By a second method, a pad oxide layer is formed on the epitaxial layer. Then, a nitride pattern for defining an isolation region is formed on the pad oxide layer. The epitaxial layer under the pad oxide layer exposed by the pattern is thermally oxidized, and then the pattern and the pad oxide layer are removed to complete the isolation region. By a third method, a nitride pattern for defining an isolation region is formed on the epitaxial layer. The epitaxial layer is etched using the pattern as a mask, to form a groove in the epitaxial layer. The epitaxial layer having the groove is thermally oxidized, and then the nitride pattern is removed, to complete the isolation region.

By a fourth method, a pad oxide layer is formed on the epitaxial layer. A pattern for defining an isolation region is formed on the pad oxide layer. Then, the pad oxide layer and the epitaxial layer are etched using the pattern as a mask, to form a groove in the epitaxial layer. The epitaxial layer having the formed groove is thermally oxidized, and then the pattern and the pad oxide layer are removed, to complete the isolation region.

According to an embodiment of the present invention, an isolation region is formed as follows. First, a first oxide layer is formed on a semiconductor substrate. A pattern of a material that prevents oxidizing of the under layer, such as nitride, is formed on the first oxide layer for defining a trench. The first oxide layer and the semiconductor substrate are etched using the pattern as a mask to form a trench. A second oxide layer is formed only on a surface of the trench using the pattern as a mask against oxidizing silicon outside the trench. The pattern and the first oxide layer are removed. The epitaxial layer is grown on the entire top surface of the semiconductor substrate. The epitaxial layer is formed at 800–1000° C. and in a thickness of 300–5000Å, depending on trench width. The epitaxial layer has the characteristic that is growing both directions of vertical and horizontal directions from silicon substrate so as to bridge over the trench. Therefore, a void remains in the trench after the epitaxial layer has grown on the silicon surface. After epitaxial growth, a portion defined as the isolation region is oxidized using lithography and oxidation of the epitaxial layer to be.

At this time, it is preferable that the second oxide layer be thicker than the first oxide layer. When the first oxide layer is removed, the second oxide layer can be formed as a sidewall spacer within the trench.

Summarizing the present invention, an epitaxial layer is grown over the entire surface of a semiconductor substrate including trench area As a result, a void remains in the trench after the epitaxial layer has been grown over the entire silicon surface. Subsequently, a portion of the epitaxial layer over the trench is thermally oxidized, to form an isolation oxide layer. Accordingly, stress caused by oxidation of a material filling the inside of the trench is not generated, which prevents crystal defects from being generated on the sidewalls of the trench. This process also has the advantages of relative simplicity and consistent reproducibility.

BRIEF DESCRIPTION OF THE DRAWINGS

The above object, features and advantages of the present invention will become more apparent by describing in detail preferred embodiments thereof with reference to the attached drawings in which.

DESCRIPTION OF THE PREFERRED EMBODIMENTS

Figure 1:
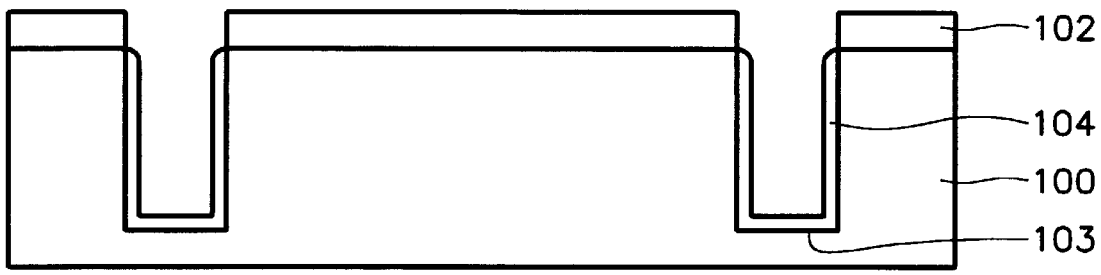
FIGS. 1 through 4 are sectional views sequentially showing processes of an isolation method according to a first embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are not to scaled but are emphasized for clarity. Like numbers refer to like elements throughout. It will also be understood that when a layer is referred to as being "on" another layer or substrate, it can be directly on the other layer or substrate, or intervening layers may also be present.

Embodiment 1

Referring to FIG. 1, a nitride layer pattern 102 for defining a trench is formed on a silicon semiconductor substrate 100 to surround an active region to be formed in the substrate. Then the semiconductor substrate 100 is partially etched using a nitride layer pattern 102 as a mask, to form a trench 103. Subsequently, a thin oxide layer 104 (for example, 200–1000Å) is formed only on a surface of the trench 103.

Preferably, the thickness of the nitride layer pattern 102 is 500–2500Å, the depth of the trench 103 is 0.05–1.0 $\mu$m, and the oxide layer 104 formed on the surface of the trench 103 has a thickness of 500Å or less. The oxide layer 104 formed only on the surface of the trench 103 functions to recover damage of the substrate generated through an etching process for forming the trench 103, to surround an edge portion of the active region, and to make an epitaxial layer grow only on the top of substrate 100 in a subsequent process.

Figure 2:
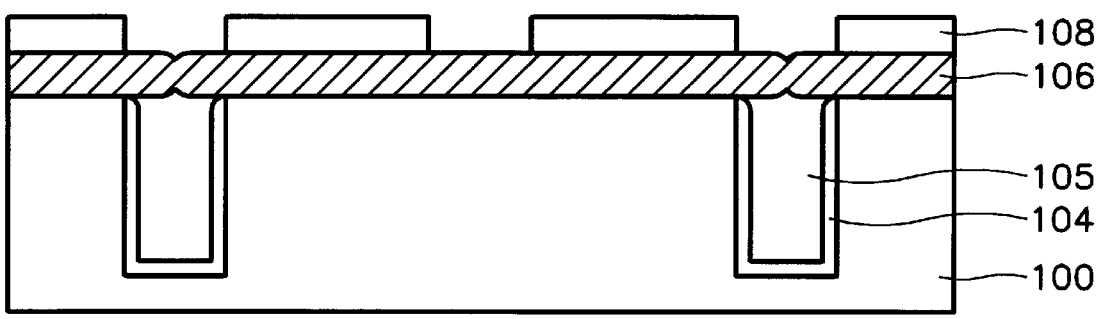

Referring to FIG. 2, after the nitride layer pattern 102 is removed, a process for epitaxial growth is performed which selectively form a single crystalline silicon layer 106 only on the silicon substrate 100. As the oxide layer 104 is formed on the surface of the trench 103, the epitaxial layer 106 does not grow on the surface of the trench 103, but grows only on the top surface of the substrate. At this time, the epitaxial layer 106 grows horizontally as well as vertically according to a ratio of a vertical growth rate to a horizontal growth rate of approximately 1:0.5. Accordingly, when the epitaxial layer 106 is grown by at least a predetermined thickness, an opening of the trench 103 of a width less than such thickness is covered with the epitaxial layer 106, which encloses the trench while leaving the inside of the trench 103 empty. It is preferable to form the epitaxial layer 106 in a thickness of 300–5000Å at 800–1000° C. A nitride layer pattern 108 for defining an active region is formed on the epitaxial layer 106.

Figure 3:
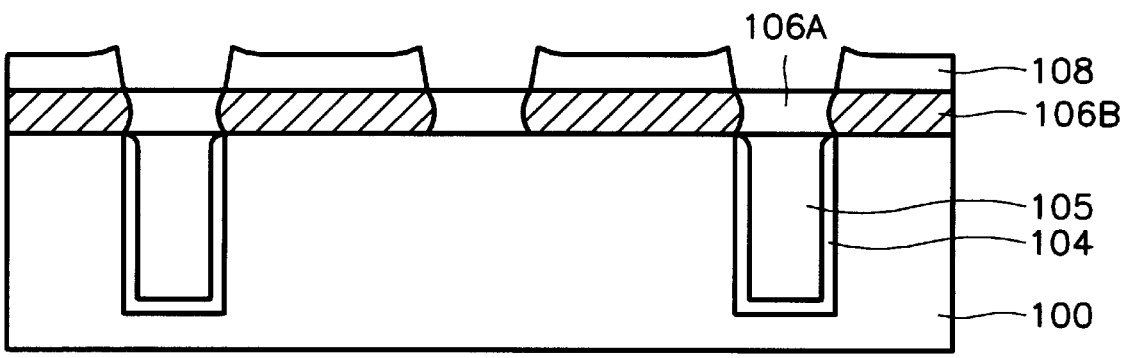
Figure 4:
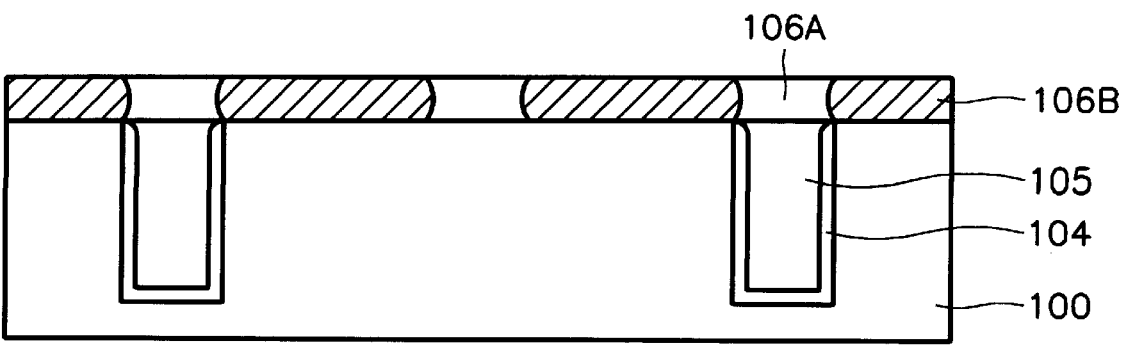

As shown in FIG. 3, when a resultant structure having the nitride layer pattern 108 is heat-treated in an oxygen atmosphere, only an exposed portion of epitaxial layer 106 is converted into an oxide layer 106A and a portion covered with the nitride layer pattern 108 remains as an epitaxial silicon layer 106B. The nitride layer pattern 108 is removed, as shown in FIG. 4, so that the oxide layer 106A becomes an isolation region and the unoxidized epitaxial layer 106B becomes an active region 106B.

According to the isolation method of the first embodiment, a pad oxide layer is not formed on the epitaxial layer 106. Accordingly, it is possible to prevent bird's beak phenomenon which is conventionally generated by oxygen diffusing laterally along the pad oxide layer to raise a nitride layer pattern.

Also, as the inside of the trench 103 remains an empty space 105, stress is not applied to the sidewalls of the trench 103 during the oxidation process. Accordingly, it is possible to reduce effectively leakage current caused by crystal defects in the sidewalls of the trench 103. Further, unlike the combination method of the SEPOX with the trench isolation, an unoxidized polysilicon layer need not to be removed and an unoxidized epitaxial layer 106B remains for the active region. Accordingly, less of a step is generated between the active region and the isolation region.

Embodiment 2

According to a second embodiment, a pad oxide layer 201 is formed on the entire surface of a semiconductor substrate 200 before forming a trench, to thereby prevent damage of the substrate 200 on which the epitaxial layer 206 is to be formed.

Figure 5:
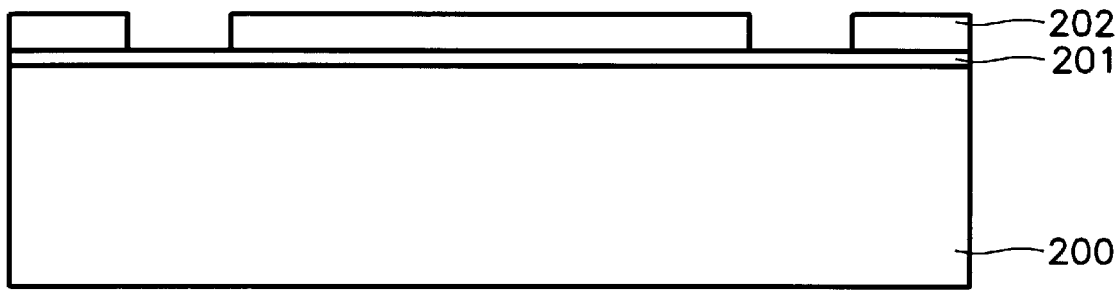
FIGS. 5 through 9 are sectional views sequentially showing processes of an isolation method according to a second embodiment of the present invention.

Referring to FIG. 5, the pad oxide layer 201 (e.g. 100–500Å thick) is formed on the entire surface of the semiconductor substrate 200. Then, a nitride layer pattern 202 exposing a region in which a trench is to be formed is formed on the pad oxide layer 201 in a thickness of 500–2500Å.

Figure 6:
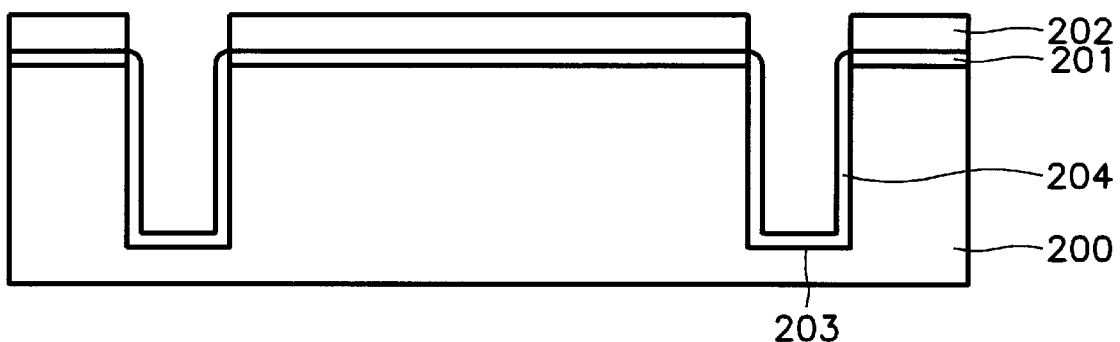

Referring to FIG. 6, the semiconductor substrate 200 is etched to depth of 0.05–1.0 $\mu$m using the nitride layer pattern 202 as a mask. Then, an oxide layer 204 is formed on the surface of the trench 203. At this time, it is preferable that a thickness of the oxide layer 204 formed on the surface of the trench 203 be thicker than that of the pad oxide layer 201 for example 200–1000Å.

Figure 7:
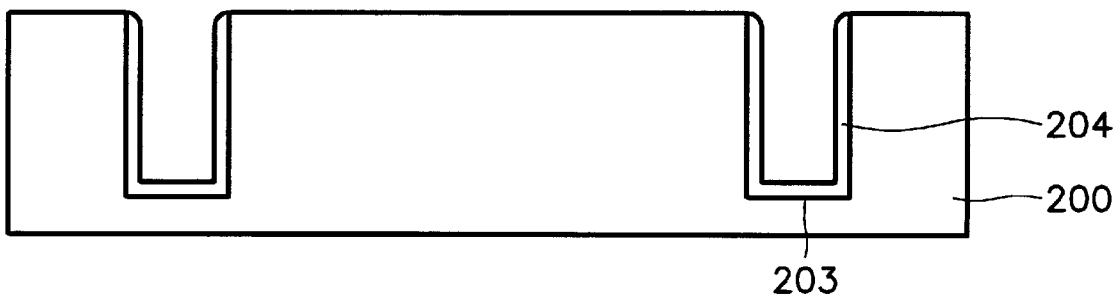

As shown in FIG. 7, the nitride layer pattern 202 is removed, and then the pad oxide layer 201 is removed using a wet-etching method. That is, the pad oxide layer 201 can prevent damage of the substrate 200 during removing the nitride layer pattern 202. Accordingly, a nondefective epitaxial layer (206 of FIG. 16) can be formed on the undamaged semiconductor substrate 200 during a subsequent process. Also, a thickness of the oxide layer 204 formed on the surface of the trench 203 is thicker than that of the pad oxide layer 201, so that a portion of the oxide layer 204 remains on the surface of the trench 203 even [with the] after wet-etching remove the pad oxide layer 201.

Figure 8:
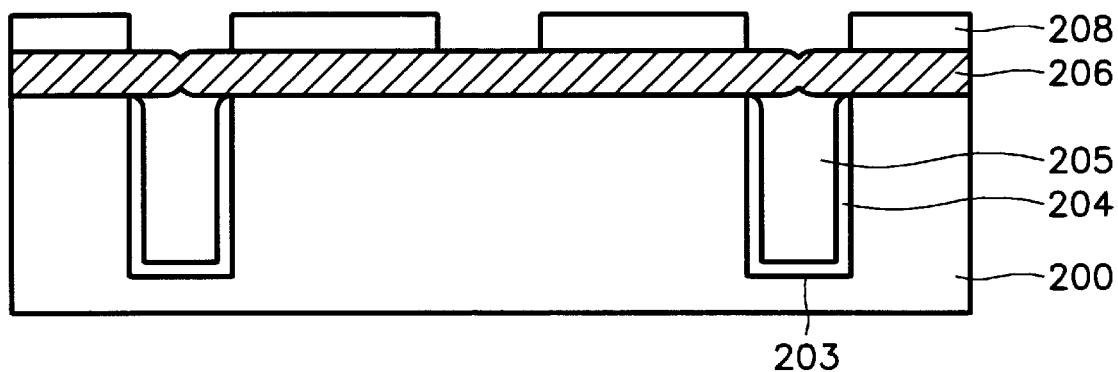

A subsequent process of forming an epitaxial layer and an isolation region is performed in the same way as that of first embodiment. That is, as shown in FIG. 8, the epitaxial layer 206 is selectively formed on the entire surface of the semiconductor substrate 200, and then a nitride layer pattern 208 for defining an active region is formed on the epitaxial layer 206.

Figure 9:
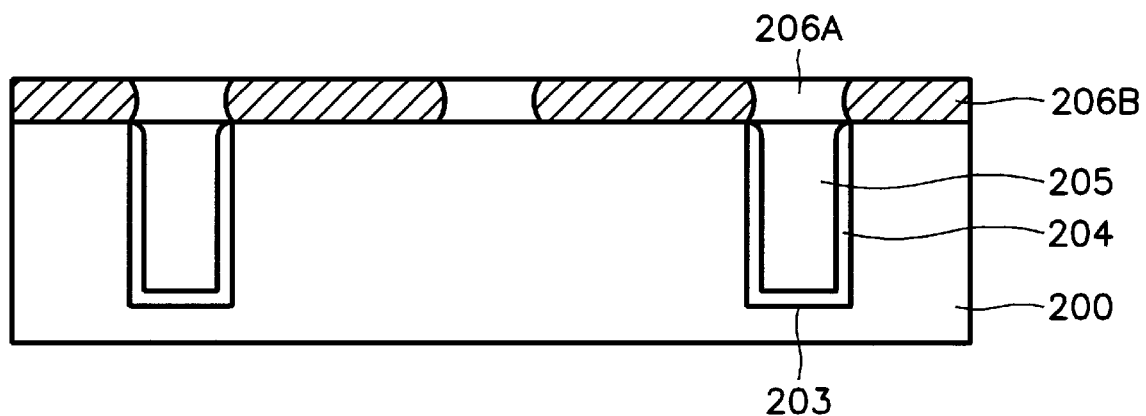

As shown in FIG. 9, the epitaxial layer 206 exposed by the nitride layer pattern 208 is converted into an oxide layer 206A through heat treatment at an oxygen atmosphere, and then the nitride layer pattern 208 is removed, so that the oxide layer 206A becomes an isolation region.

Embodiment 3

According to a third embodiment, a pad oxide layer 301 is formed on a semiconductor substrate 300 to prevent damage of the semiconductor substrate 300, like the second embodiment. However, an oxide layer 304 formed on the surface of the trench 303 is converted into a spacer 304A during a process of removing the pad oxide layer 301, which is different from the second embodiment.

Figure 10:
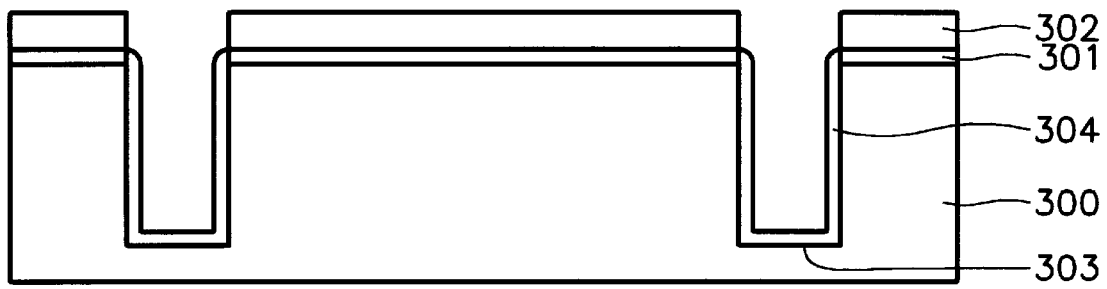
FIGS. 10 through 13 are sectional views sequentially showing processes of an isolation method according to a third embodiment of the present invention.

As shown in FIG. 10, the pad oxide layer 301 is formed on the semiconductor substrate 300, and then a nitride layer pattern 302 for defining a trench region is formed. The semiconductor substrate 300 is etched using the nitride layer pattern 302 as a mask to form the trench 303. Then the oxide layer 304 is formed on the surface of the trench to be thicker than that of the pad oxide layer.

Figure 11:
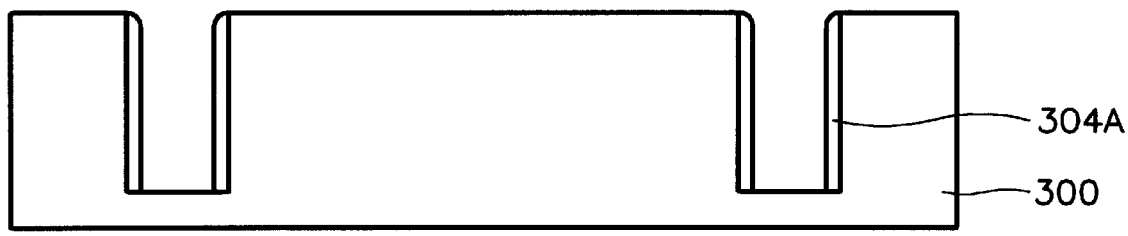

As shown in FIG. 11, the nitride layer pattern 302 is removed. Subsequently, the pad oxide layer 301 is removed using anisotropic dry etching method and at the same time a portion of the oxide layer 304 formed on the bottom of the trench 303 is also removed. Accordingly, the oxide layer spacer 304A remains only on the sidewall of the trench 303.

Figure 12:
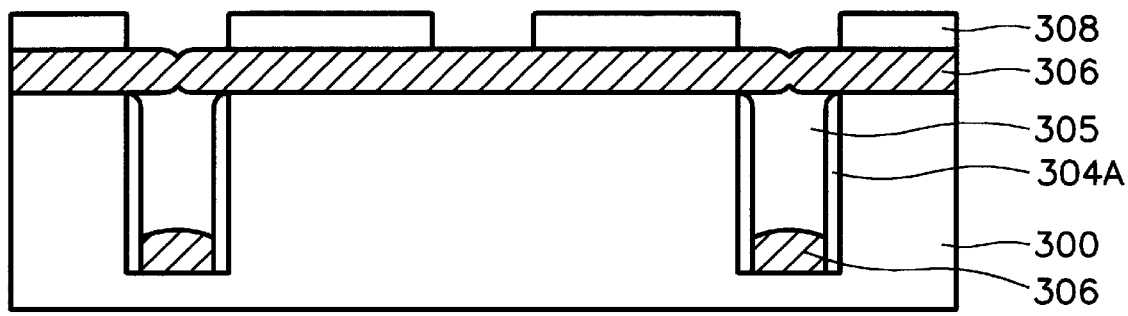
Figure 13:
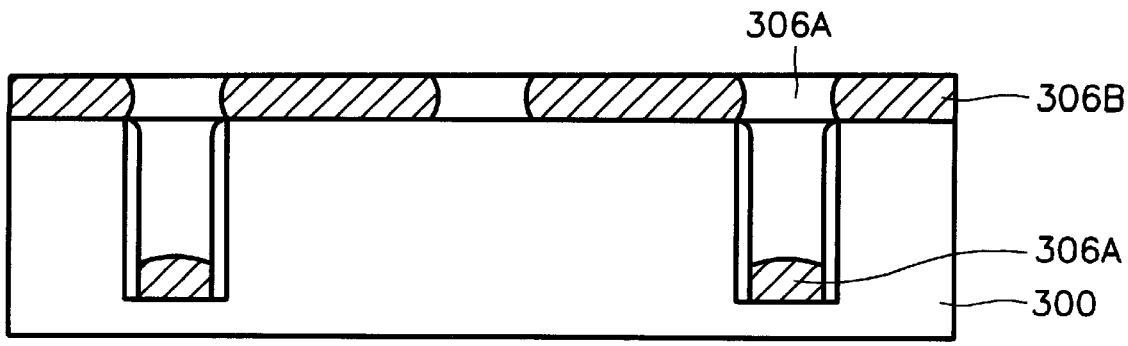

As shown in FIG. 12, an epitaxial layer 306 is grown on the entire surface of the semiconductor substrate 300 to cover an opening of the trench 303. At this time, due to the oxide layer spacer 304A remaining on the sidewall of the trench 303, the epitaxial layer is not formed on the sidewall of the trench 303. However, the epitaxial layer 306 is formed on the bottom free of the oxide layer. Then, a nitride layer pattern 308 for defining an active region is formed on the epitaxial layer 306 formed on the substrate 300.

The resultant structure having the nitride layer pattern 308 is thermally oxidized, to convert the epitaxial layer 306 exposed by the nitride layer pattern 308 into the oxide layer 306A. Subsequently, the nitride layer pattern 308 is removed so that the oxide layer 306A becomes an isolation region.

According to the third embodiment, like the second embodiment, the pad oxide layer 301 is formed on the semiconductor substrate 300 to prevent damage of the semiconductor substrate 300. Accordingly, the epitaxial layer can be easily grown and has good characteristics. Also, the epitaxial layer 306 is formed only on the bottom of the trench 303, however, not formed on the sidewall thereof. Accordingly, crystal defects are not generated in the sidewall of the trench 303 being in contact with an impurity region of the transistor.

Embodiment 4

According to the fourth embodiment, a pad oxide layer 407 for protecting an epitaxial layer 406 is formed before a nitride layer pattern 408 for defining an active region is formed, which is different from the first embodiment.

Figure 14:
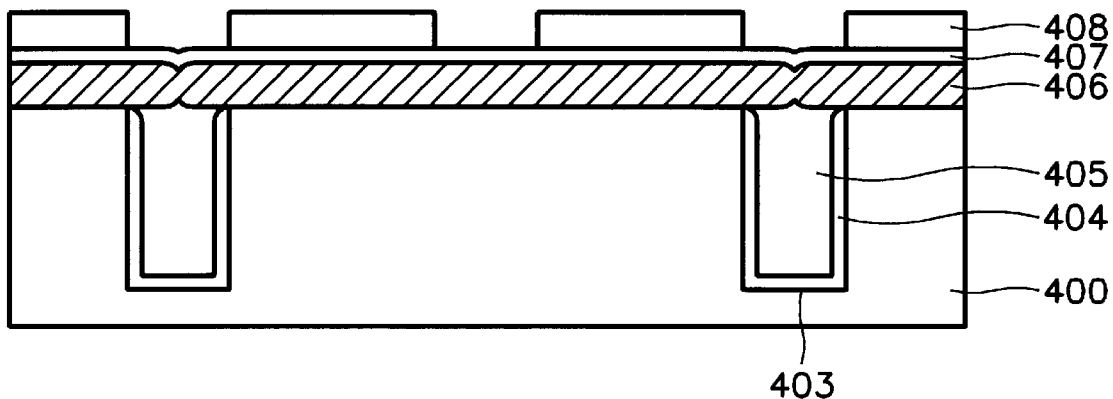
FIGS. 14 through 16 are sectional views sequentially showing processes of an isolation method according to a fourth embodiment of the present invention.

Referring to FIG. 14, a trench 403 is formed in a semiconductor substrate 400 and an oxide layer 404 is formed on a surface of the trench 403, and then the epitaxial layer 406 is formed to make the inside of the trench 403 empty, which is performed the same way as in the first embodiment. Then, the pad oxide layer 407 is formed on the epitaxial layer 406, and then the nitride layer pattern 408 for defining an active region is formed.

Figure 15:
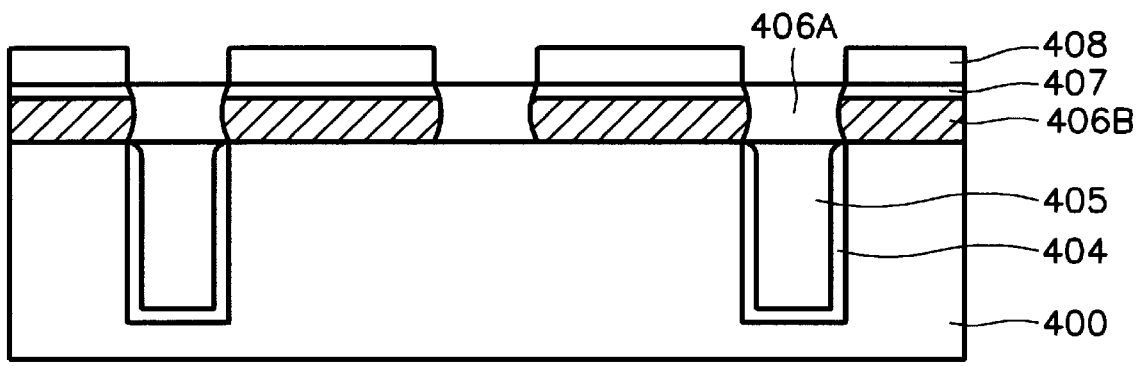
Figure 16:
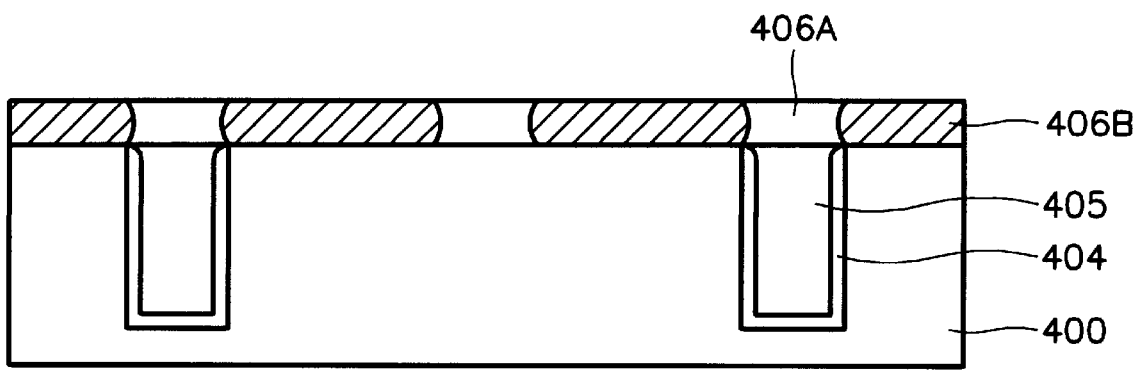

As shown in FIG. 15, the epitaxial layer 406 under the portion of the pad oxide layer 407 exposed by the nitride layer pattern 408 is oxidized, to form an oxide layer 406A. Subsequently, as shown in FIG. 16, the nitride layer pattern 408 is removed. During an etching process for removing the nitride layer pattern 408, the pad oxide layer 407 prevents damage to the epitaxial layer 406B by the etching process. Accordingly, the epitaxial layer 406B can be used for an active region, which results in a device having an enhanced characteristic.

Embodiment 5

Figure 17:
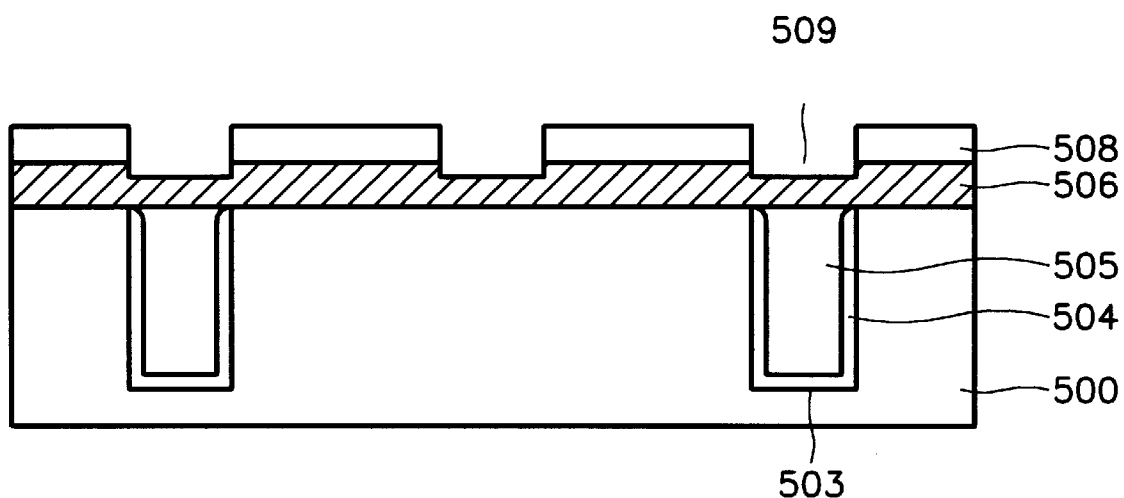
FIGS. 17 through 18 are sectional views sequentially showing processes of an isolation method according to a fifth embodiment of the present invention.

According to a fifth embodiment, a process of forming a nitride layer pattern 508 for defining an active region on an epitaxial layer 506 resembles that of the first embodiment. As shown in FIG. 17, the epitaxial layer 506 is partially etched before oxidation, using the nitride layer pattern 508 as a mask, to form a groove 509, which is different from the first embodiment. At this time, it is preferable to form the groove in depth of 200–5000Å.

Figure 18:
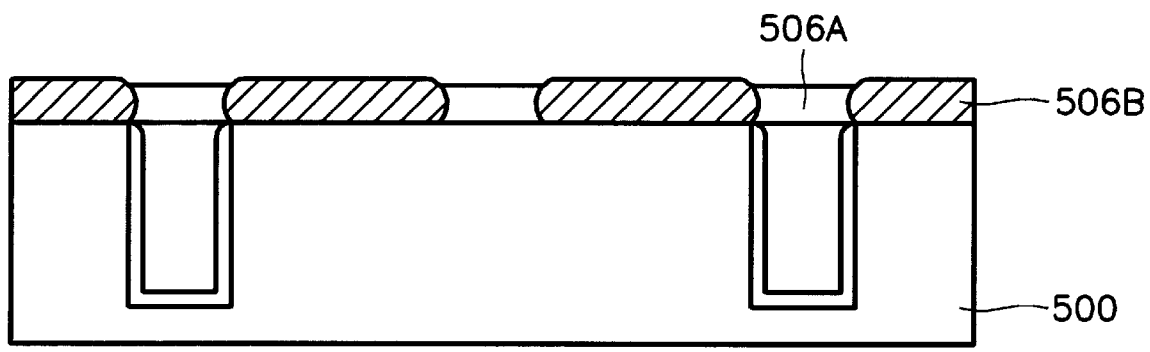

Subsequently, as shown in FIG. 18, the epitaxial layer exposed by the nitride layer pattern 508 is thermally oxidized, to form an oxide layer 506A, and then the nitride layer pattern 508 is removed, to complete an isolation region.

According to the fifth embodiment, the groove 509 is formed in the epitaxial layer to reduce a thickness of the epitaxial layer to be formed into a field oxide layer 506A, so that the period of time for oxidation can be reduced, and the surface structure is more planar.

Embodiment 6

Combining the second (or third) embodiment with the fourth embodiment, a first pad oxide layer is formed on a semiconductor substrate to prevent damage of the substrate where the epitaxial layer is to be formed, and a second pad oxide layer is formed on the epitaxial layer to prevent damage of an active region.

Embodiment 7

Combining the second (or third) embodiment with the fifth embodiment, a pad oxide layer is formed on a semiconductor substrate to prevent damage of the substrate. Also, the epitaxial layer is partially etched to form a groove where a field oxide layer is to be formed, so that a period of time for an oxidation process can be reduced.

Embodiment 8

Combining the fourth embodiment with the fifth embodiment, a pad oxide layer is formed on an epitaxial layer to prevent damage to an active region. Also, the epitaxial layer where a field oxide layer is to be formed is partially etched to form a groove, so that a period of time for an oxidation process can be reduced.

Embodiment 9

Combining the second (or third) embodiment, the fourth embodiment and the fifth embodiment, a first pad oxide layer is formed on a semiconductor substrate, to prevent damage of the semiconductor substrate. Also, a second pad oxide layer is formed on an epitaxial layer to prevent damage of an active region, and the epitaxial layer where a field oxide layer is to be formed is partially etched to form a groove, so that a period of time for oxidation can be reduced.

As described above, according to the present invention, the trench isolation and the LOCOS method using an epitaxial layer are combined to form an isolation region. Especially, the distinguishing feature of the resulting structure is that an inside of the trench is empty. Accordingly, during a process of thermal oxidation for converting an epitaxial layer formed on the entire surface of a substrate and covering an opening of a trench into a field oxide layer, stress caused by oxidation of a material filling the trench is not generated. Accordingly, crystal defects in the sidewalls of the trench caused by the stress can be prevented. When a device is manufactured using the method of the present invention, leakage current can be reduced to enhance reliability of the device. Also, a step between an active region and an isolation region can be reduced or prevented. Further a process of removing a polysilicon layer which is used for forming an isolation region is not required as in the SEPOX process, which simplifies the fabrication process.

We claim:

1. An isolation processing method for a semiconductor device comprising the steps of:
   a) forming a trench in a semiconductor substrate;
   b) forming a layer of single-crystal semiconductor atop the semiconductor substrate and across the trench, thereby leaving a void inside the trench; and
   c) oxidizing a portion of the layer of single-crystal semiconductor over the trench to complete an isolation region.

2. The isolation method of claim 1 wherein forming a layer of single-crystal semiconductor includes growing an epitaxial layer of semiconductor.

3. The isolation method of claim 1 further including the step of forming an insulation layer only on a surface of the trench before said step of forming a layer of single-crystal semiconductor.

4. The isolation method of claim 3 wherein said step of forming an insulation layer includes forming an oxide layer.

5. The isolation method of claim 1 wherein step a) comprises the steps of:
   forming a pattern for defining the trench on a semiconductor substrate; and
   etching the semiconductor substrate using the pattern as a mask to form the trench.

6. The isolation method of claim 3 wherein said step of forming an insulation layer only on a surface of the trench comprises the steps of:
   forming an oxide layer on the entire surface of the semiconductor substrate, including the trench; and
   removing the oxide layer from the top surface of the semiconductor substrate, thereby leaving the oxide layer only on the surface of the trench.

7. The isolation method of claim 2, wherein the epitaxial layer is about 300–5000Å thick.

8. The isolation method of claim 1 wherein step c) comprises the steps of:
   forming a pattern for defining an isolation region on the layer of single-crystal semiconductor;
   thermally oxidizing the layer of single-crystal semiconductor exposed by the pattern; and
   removing the pattern.

9. The isolation method of claim 1 wherein step c) comprises the steps of:
   forming a pad oxide layer on the layer of single-crystal semiconductor,
   forming a pattern for defining an isolation region on the pad oxide layer;
   thermally oxidizing the layer of single-crystal semiconductor under the pad oxide layer exposed by the pattern; and
   removing the pattern and the pad oxide layer.

10. The isolation method of a semiconductor device of claim 1 wherein step c) comprises the steps of:
    forming a pattern for defining an isolation region on the layer of single-crystal semiconductor;
    etching the layer of single-crystal semiconductor using the pattern as a mask to form a groove in the layer of single-crystal semiconductor;
    thermally oxidizing the layer of single-crystal semiconductor including the groove; and
    removing the pattern.

11. The isolation method of claim 1 wherein step c) comprises the steps of:
    forming a pad oxide layer on the layer of single-crystal semiconductor;
    forming a pattern for defining an isolation region on the pad oxide layer;
    etching the pad oxide layer and the layer of single-crystal semiconductor using the pattern as a mask to form a groove in the layer of single-crystal semiconductor,
    thermally oxidizing the layer of single-crystal semiconductor including the groove; and
    removing the pattern and the pad oxide layer.

12. An isolation method for a semiconductor device comprising the steps of:
    a) forming a first oxide layer on a semiconductor device;
    b) forming a pattern on the first oxide layer for defining a trench;
    c) etching the first oxide layer and the semiconductor substrate using the pattern as a mask, thereby forming said trench;
    d) forming a second oxide layer only on a surface of the trench;
    e) removing the pattern and the first oxide layer;
    f) growing an epitaxial layer over the entire surface of the semiconductor substrate including over the trench, thereby leaving an empty space inside the trench; and
    g) oxidizing a portion of the epitaxial layer over the trench to complete an isolation region.

13. The isolation method of claim 12 wherein the second oxide layer is thicker than the first oxide layer.

14. The isolation method of claim 12 wherein step e) includes leaving a portion of the second oxide layer on a sidewall of the trench to form a sidewall spacer.

15. The isolation method of claim 12, wherein the epitaxide layer is approximately 300–5000Å thick.

16. The isolation method of claim 12 wherein step g) comprises the steps of:
    forming a third oxide layer on the epitaxial layer,
    forming a pattern for defining an isolation region on the third oxide layer,
    thermally oxidizing a portion of the epitaxial layer under the third oxide layer exposed by the pattern; and
    removing the pattern and the third oxide layer.

17. The isolation method of claim 12 wherein step g) comprises the steps of:
    forming a pattern for defining an isolation region on the epitaxide layer;
    etching the epitaxial layer using the pattern as a mask to form a groove in the epitaxial layer;

thermally oxidizing the epitaxial layer including the groove; and removing the pattern.

18. The isolation method of claim 12 wherein step g) comprises the steps of:

forming a third oxide layer on the epitaxial layer;

forming a pattern for defining an isolation region on the third oxide layer over the trench;

etching the third oxide layer and a portion of the epitaxial layer using the pattern as a mask to form a groove in the epitaxial layer over the trench;

thermally oxidizing exposed portions of the epitaxial layer including the groove; and removing the pattern and the third oxide layer.

\* \* \* \* \*

UNITED STATES PATENT AND TRADEMARK OFFICE
CERTIFICATE OF CORRECTION

PATENT NO.   : 5,926,721
DATED        : July 20, 1999
INVENTOR(S)  : Hong et al.

It is certified that error appears in the above-identified patent and that said Letters Patent is hereby corrected as shown below:

Column 2,
Lines 9 and 53, "-" should read -- ~ --.

Column 3,
Lines 56 and 58, "-" should read -- ~ --.

Column 4,
Lines 14, 49, 53, 55 and 60, "-" should read -- ~ --.

Column 6,
Line 26, "-" should read -- ~ --.

Column 7,
Line 53, "-" should read -- ~ --.

Column 8,
Line 52, "-" should read -- ~ --.
Line 65, "epitaxide" should read -- epitaxial --.

Signed and Sealed this

Second Day of July, 2002

Attest:

JAMES E. ROGAN
Attesting Officer    Director of the United States Patent and Trademark Office